United States Patent
Park et al.

(10) Patent No.: US 7,962,831 B2
(45) Date of Patent: Jun. 14, 2011

(54) MULTI-LEVEL CELL MEMORY DEVICE AND METHOD THEREOF

(75) Inventors: Sung Chung Park, Daejeon (KR); Jun Jin Kong, Yongin-si (KR); Young Hwan Lee, Suwon-si (KR); Dong Ku Kang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1041 days.

(21) Appl. No.: 11/808,173

(22) Filed: Jun. 7, 2007

(65) Prior Publication Data

US 2008/0137414 A1  Jun. 12, 2008

(30) Foreign Application Priority Data

Dec. 6, 2006  (KR) .................... 10-2006-0123339

(51) Int. Cl.
*G11C 29/00* (2006.01)
(52) U.S. Cl. ........................................ 714/763
(58) Field of Classification Search .................. 714/746, 714/762–764, 786–788
See application file for complete search history.

(56) References Cited

U.S. PATENT DOCUMENTS

| 5,515,317 | A | 5/1996 | Wells et al. |
| 6,097,637 | A | 8/2000 | Bauer et al. |
| 6,279,133 | B1 | 8/2001 | Vafai et al. |
| 7,096,406 | B2 * | 8/2006 | Kanazawa et al. ............ 714/763 |
| 7,366,462 | B2 * | 4/2008 | Murali et al. ................ 455/3.06 |
| 7,388,781 | B2 * | 6/2008 | Litsyn et al. ............ 365/185.09 |
| 7,409,623 | B2 * | 8/2008 | Baker et al. .................... 714/763 |

OTHER PUBLICATIONS

International Search Report dated Sep. 28, 2007, for International Application No. PCT/KR2007/003001.

* cited by examiner

*Primary Examiner* — Shelly A Chase
(74) *Attorney, Agent, or Firm* — Harness, Dickey & Pierce, P.L.C.

(57) ABSTRACT

A Multi-Level Cell (MLC) memory device and method thereof are provided. The example MLC memory device may be configured to perform data operations, and may include an MLC memory cell, a first coding device performing a first coding function, the first coding function being one of an encoding function and a decoding function, a second coding device performing a second coding function, the second coding function being one of an encoding function and a decoding function and a signal module configured to perform at least one of instructing the MLC memory cell to store data output by the second coding device if the first and second coding functions are encoding functions, and generating a demapped bit stream based on data retrieved from the MLC memory cell if the first and second coding functions are decoding functions.

28 Claims, 11 Drawing Sheets

MULTI-LEVEL CELL MEMORY DEVICE AND METHOD THEREOF

PRIORITY STATEMENT

This application claims the benefit of Korean Patent Application No. 10-2006-0123339, filed on Dec. 6, 2006, in the Korean Intellectual Property Office, the disclosure of which is incorporated herein by reference.

BACKGROUND OF THE INVENTION

1. Field of the Invention

Example embodiments of the present invention relate generally to a multi-level cell (MLC) memory device and method thereof, and more particularly to a multi-level cell (MLC) memory device configured to perform data operations and method thereof.

2. Description of Related Art

Conventional Single-Level Cell (SLC) memory may store single-bit data in a single memory cell. Thus, a SLC memory may be referred to as a single bit cell (SBC).

FIG. 1 illustrates a cell threshold voltage in a conventional SLC memory. As shown in FIG. 1, single-bit data may be stored and read at different voltages or "distributions". Referring to FIG. 1, two distributions may be divided by a threshold voltage, denoted by a vertical dotted line in FIG. 1, programmed in a memory cell. For example, if a voltage from 0.5 volts to 1.5 volts is read from the memory cell, data stored in the memory cell may be interpreted as a first logic level (e.g., a higher logic level or logic "1"). If a voltage from 2.5 volts to 3.5 volts is read from the memory cell, data stored in the memory cell may be interpreted as a second logic level (e.g., a lower logic level or logic "0"). Data stored in the memory cell may be classified based on a difference between cell currents or cell voltages during a data read operation.

A conventional Multi-Level Cell (MLC) memory may be more highly integrated than an SLC. MLC memory may also be referred to as a multi-bit cell (MBC) memory. However, as a number of bits stored in a single memory cell increases, a reliability of the stored memory may decrease, and a read failure rate may increase. If m bits are stored in a single memory cell, $2^m$ number of distributions (e.g., separate voltage ranges for each associated bit) may be formed. However, because a voltage window associated with each distribution may be limited, a threshold voltage difference between neighboring bits may decrease and a read failure rate may increase as m increases. Therefore, it may be difficult to increase a storage density of a conventional MLC memory.

SUMMARY OF THE INVENTION

An example embodiment of the present invention is directed to a Multi-Level Cell (MLC) memory device configured to perform data operations, including an MLC memory cell, a first coding device performing a first coding function, the first coding function being one of an encoding function and a decoding function, a second coding device performing a second coding function, the second coding function being one of an encoding function and a decoding function and a signal module configured to perform at least one of instructing the MLC memory cell to store data output by the second coding device if the first and second coding functions are encoding functions, and generating a demapped bit stream based on data retrieved from the MLC memory cell if the first and second coding functions are decoding functions.

Another example embodiment of the present invention is directed to a method of performing a data operation with a MLC memory device, including performing a first coding function, the first coding function being one of an encoding function and a decoding function, performing a second coding function, the second coding function being one of an encoding function and a decoding function and performing at least one of instructing a MLC memory cell to store data output as a result of the second coding function if the first and second coding functions are encoding functions, and generating a demapped bit stream based on data retrieved from the MLC memory cell if the first and second coding functions are decoding functions.

Another example embodiment of the present invention is directed to an error correction scheme performed at a MLC memory to increase a stability of the MLC memory and increase a number of bits capable of being stored in a single memory cell of the MLC memory.

Another example embodiment of the present invention is directed to an error correction scheme to an MLC memory which allows a dynamic adjustment to an amount of overhead by the error correction scheme.

Another example embodiment of the present invention is directed to a higher storage density MLC memory capable of storing more than four bits in a single memory cell of the MLC memory.

Another example embodiment of the present invention is directed to an error correction scheme robust against both a random error and a burst error in an MLC memory.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS

Figure 1:
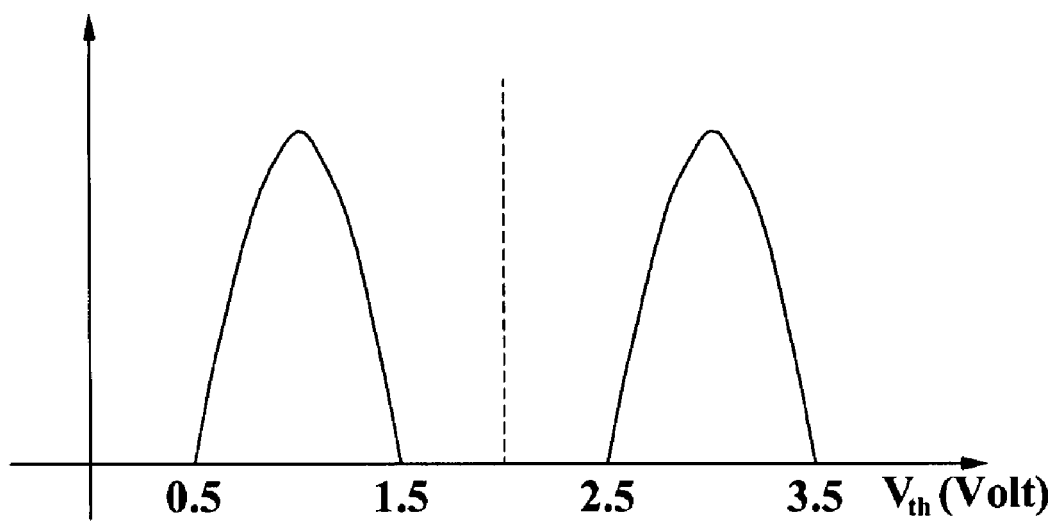
FIG. 1 illustrates a cell threshold voltage in a conventional SLC memory.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
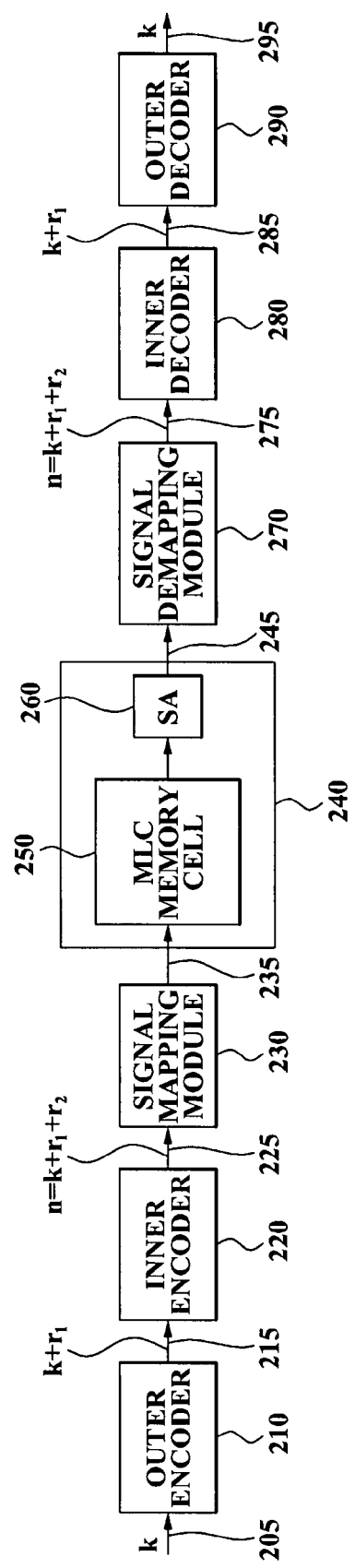
FIG. 2 is a block diagram illustrating a Multi-Level Cell (MLC) memory device 200 according to an example embodiment of the present invention.

FIG. 2 is a block diagram illustrating a Multi-Level Cell (MLC) memory device 200 according to an example embodiment of the present invention.

In the example embodiment of FIG. 2, the MLC memory device 200 may include an outer encoder 210, an inner encoder 220, a signal mapping module 230, an MLC memory cell array 240, a signal demapping module 270, an inner decoder 280, and an outer decoder 290.

In the example embodiment of FIG. 2, the MLC memory device 200 may utilize a concatenated coding where an outer coding and an inner coding may be concatenated to store and read data. For example, a block coding may be utilized for the outer coding, and a convolutional coding may be utilized for the inner coding. The block coding may correspond to a scheme of encoding and decoding data into a plurality of block units. The convolutional coding may correspond to a scheme of utilizing previous data and/or current data for coding. Because convolutional coding may utilize the previous data for coding, a storage device to store the previous data need not be included. The block coding may be robust against detecting and correcting a burst error, and the convolutional coding may be robust for detecting and correcting a random error. In an example, the block coding may be utilized for the outer coding, and the convolutional coding may be utilized for the inner coding. Therefore, as will be described in greater detail below, an error correction performance of the MLC memory device 200 may be robust against both a burst error and a random error.

In the example embodiment of FIG. 2, the outer encoder 210 may receive source data to store in the MLC memory device, and may encode the received source data using a first encoding scheme to generate an outer encoded bit stream 215. In an example, the first encoding scheme may utilize a linear block encoding. Examples of linear block encoding may include a hamming coding, a Bose Chaudhuri Hocquenghem (BCH) coding, a Reed-Solomon (RS) coding, a Golay coding, etc. The linear block encoding may convert the received source data into k-bit units (e.g., k may be a positive integer). For example, the linear block encoding may divide the received source data into the k-bit units. The outer encoder 210 may add $r_1$ bits of overhead to a blocked k-bit bit stream 205 and may generate $k+r_1$ bits of the outer encoded bit stream 215. Therefore, a code rate of the outer encoder 210 may become $k/(k+r_1)$. The added $r_1$ bits may be added to the k-bit bit stream 205 as a parity bit. In an example, if data is read from the MLC memory device 200, the inner decoder 280 may detect an error in k-bit data and may correct the detected error based on the $r_1$ bits.

In the example embodiment of FIG. 2, the inner encoder 220 may encode the outer encoded bit stream 215 using a second encoding scheme to generate an inner encoded bit stream 225. In an example, the second encoding scheme may utilize a convolutional code encoding. The convolutional code encoding may detect and correct an error by using a convolutional relation between current data and previous data. The inner encoder 220 may encode $k+r_1$ bits of the outer encoded bit stream 215 to generate $k+r_1+r_2$ bits of the inner encoded bit stream 225. Therefore, $r_2$ bits of overhead may be added by the inner encoder 220 and a code rate of the inner encoder 220 may become $(k+r_1)/(k+r_1+r_2)$. If n is utilized for $k+r_1+r_2$, the code rate of the outer encoder 210 and the inner encoder 220 may become $k/n$. As discussed above, convolutional code encoding may be robust for detecting and correcting a random error.

In the example embodiment of FIG. 2, the inner encoded bit stream 225 generated by the inner encoder 220 may be stored in a MLC memory cell 250 by the signal mapping module 230. For example, the inner encoded bit stream 225 may correspond to digital data stored in the MLC memory cell 250. In another example, the inner encoded bit stream 225 may include n bits, wherein n may denote a positive integer. If a kth bit corresponding to a given number of the n bits maintains a value of the k-bit bit stream 205, the inner encoded bit stream 225 may be referred to as a systematic code. Conversely, if the n-bit inner encoded bit stream 225 does not maintain the value of the k-bit bit stream 205, the inner encoded bit stream 225 may be referred to as a nonsystematic code. The inner encoded bit stream 225 may be generated in accordance with either a systematic code or a nonsystematic code. If the inner encoded bit stream 225 is generated in accordance with the systematic code, the data stored in the MLC memory cell 250 may maintain the value of the k-bit bit stream 205.

In the example embodiment of FIG. 2, the signal mapping module 230 may apply a program pulse 235 based on the inner encoded bit stream 225 to the MLC memory cell 250 to store the data in the MLC memory cell 250. The MLC memory cell 250 may correspond to an m-bit MLC memory cell, and the program pulse 235 may correspond to any one of $2^m$ number of levels that may be generated by a $2^m$ pulse amplitude modulation (PAM).

In the example embodiment of FIG. 2, the MLC memory cell array 240 may include a plurality of MLC memory cells 250 and a sense amplifier 260. The sense amplifier 260 may receive a signal related to the data stored in the MLC memory cell 250, and may amplify the received signal. In an example, the MLC memory cell 250 may correspond to a given memory cell of an MLC flash memory cell.

In the example embodiment of FIG. 2, the signal demapping module 270 may generate a demapped bit stream 275 from an output pulse 245 in response to applying a read signal. In an example, the output pulse 245 may be output from the MLC memory cell 250. If the MLC memory cell 250 corresponds to an N-bit MLC memory cell, the signal demapping module 270 may compare the output pulse 245 with a threshold value of $2^N$ number of distributions to generate the demapped bit stream 275 corresponding to the output pulse 245.

In the example embodiment of FIG. 2, the signal demapping module 270 may generate the demapped bit stream 275 by performing either a hard decision or a soft decision, from the output pulse 245. The hard decision may determine whether a logic level for each bit of the demapped bit stream 275 from the output pulse 245 by the signal demapping module 270 (e.g., whether the logic level is a first logic level such as logic "1" or a second logic level such as logic "0"). Similar to the hard decision, the soft decision may also determine a logic level for each bit of the demapped bit stream 275 from the output pulse 245 by the signal demapping module 270 (e.g., whether the logic level is a first logic level such as logic "1" or a second logic level such as logic "0"). However, the soft decision may further store an indicator indicating "how certain" the determination of the logic level is expected to be. For example, the soft decision may determine "sure 0", "0 but unsure", etc.

In the example embodiment of FIG. 2, if the signal demapping module 270 performs the soft decision, the inner decoder 280 may determine a logic level for each bit by based on information received from the signal demapping module 270. If the signal demapping module 270 performs the soft decision, the demapped bit stream 275 generated by the signal demapping module 270 may include more bits than n (=k+$r_1$+$r_2$) bits of the inner encoded bit stream 225. Also, an additional bit may include information about an accuracy of the decided value of each of the bits or determined logic levels (e.g., the soft decision result). If the signal demapping module 270 performs the hard decision, the demapped bit stream 275 generated by the signal demapping module 270 may include n (=k+$r_1$+$r_2$) bits corresponding to the inner encoded bit stream 225 (e.g., without the additional soft decision information indicating the level of certainty).

In the example embodiment of FIG. 2, the inner decoder 280 may decode the demapped bit stream 275 using a second decoding scheme to generate an inner decoded bit stream 285. In an example, the second decoding scheme may utilize convolutional code decoding. The inner decoder 280 may decode k+$r_1$+$r_2$ bits of the demapped bit stream 275 to generate k+$r_1$ bits of the inner decoded bit stream 285. Also, the inner decoder 280 may detect an error from the demapped bit stream 275 based on the second decoding scheme, and may correct the detected error. If the convolutional code decoding is utilized for the second decoding scheme, the inner decoder 280 may be capable of detecting and correcting a random error.

In the example embodiment of FIG. 2, the outer decoder 290 may decode the inner decoded bit stream 285 by a first decoding scheme to generates an outer decoded bit stream 295. Also, the outer decoder 290 may detect an error from the inner decoded bit stream 285 based on the first decoding scheme, and may correct the detected error. In an example, the first decoding scheme may utilize a decoding scheme corresponding to the first encoding scheme. In an example, if the first encoding scheme utilizes a linear block encoding, such as a Hamming coding, a BCH coding, an RS coding, a Golay coding, etc., the first decoding scheme may also utilize a corresponding linear block decoding. As an example, if the first encoding scheme utilizes an encoding according to the RS coding, the second decoding scheme may likewise utilize a decoding according to the RS coding. In an example, if the linear block coding is utilized, the outer decoder 290 may be capable of detecting and correcting a burst error.

In the example embodiment of FIG. 2, the inner decoder 280 may correct an error detected from the demapped bit stream 275 to generate the inner decoded bit stream 285. The outer decoder 290 may correct an error detected from the inner decoded bit stream 285 to generate the outer decoded bit stream 295. For example, an error detection and correction may be performed which includes two separate operations as described above. Therefore, a data read from the MLC memory device 200 may be more accurate than data read from a conventional MLC memory device (e.g., because additional errors may be detected/corrected), thereby allowing a "denser" MLC memory device 200 to be deployed.

In the example embodiment of FIG. 2, an error detection and error correction may have a different capability based on a decoding scheme. For example, while an error detection process may be performed on up to four bits, an error correction process may be performed on up to three bits. In this example, if a four bit error occurs, the outer decoder 290 may detect the four bit error, and may not correct the detected error. The outer decoder 290 may report an error, which may be detected and uncorrected, to an object (e.g., an operating system, a memory management program, etc.), which receives the outer decoded bit stream 295. The object may perform an additional operation based on the report and may more effectively utilize a memory (e.g., by taking the reported error into account).

Figure 3:
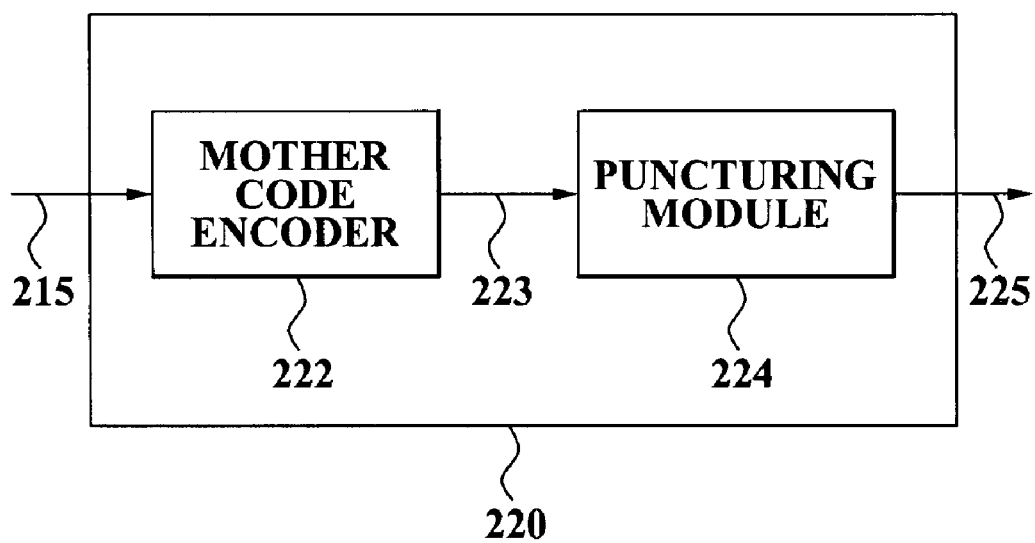
FIG. 3 is a block diagram illustrating an inner encoder according to another example embodiment of the present invention.

FIG. 3 is a block diagram illustrating the inner encoder 220 according to another example embodiment of the present invention.

In the example embodiment of FIG. 3, the inner encoder 220 may include a mother code encoder 222 and a puncturing module 224. The mother code encoder 222 may encode the outer encoded bit stream 215 with convolutional code encoding to generate a convolutional code 223. In an example, the convolutional code encoding may detect and correct an error by utilizing a convolutional relation between current data and previous data.

Figure 4:
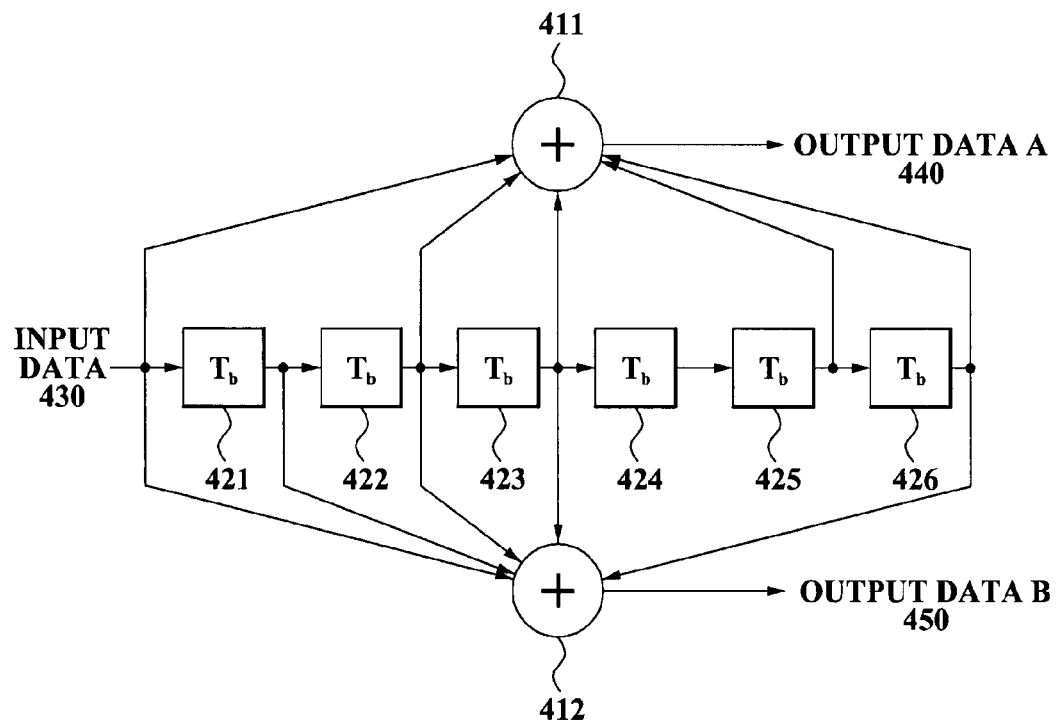
FIG. 4 illustrates a mother code encoder performing a convolutional code encoding according to another example of the present invention.

FIG. 4 illustrates a mother code encoder performing a convolutional code encoding according to another example of the present invention. In an example, the mother code encoder of FIG. 4 may correspond to the mother code encoder 222 of FIG. 3.

In the example embodiment of FIG. 4, each of blocks $T_b$ 421, 422, 423, 424, 425, and 426 may represent a flip flop (e.g., a D-flipflop). Input data 430 may be shifted to the D-flipflop 421 by a single bit per clock cycle. Also, data of D-flipflops 421, 422, 423, 424 and 425 may also be shifted to corresponding right-positioned D-flipflops 422, 423, 424, 425, and 426, respectively.

In the example embodiment of FIG. 4, the input data 430 may correspond to the outer encoded bit stream 215. An operational unit 411 may generate an output data A 440 by performing an exclusive OR (XOR) operation with respect to the input data 430, an output of the D-flipflop 422, an output of the D-flipflop 423, an output of the D-flipflop 425 and an output of the D-flipflop 426. Another operational unit 412 may generate an output data B 450 by performing an exclusive OR (XOR) operation with respect to the input data 430, an output of the D-flipflop 421, the output of the D-flipflop 422, the output of the D-flipflop 423 and the output of the D-flipflop 426. For example, the mother code encoder shown in the example embodiment of FIG. 4 may generate a two-bit convolutional code encoded code with respect to a single-bit input.

In an example, the mother code encoder of the example embodiment of FIG. 4 (e.g., a convolutional code encoder) may include a constraint length where k=7. In this example, the constraint length may indicate a total number of inputs involved in an output of the mother code encoder. The constraint length may further indicate a length (e.g., a total length) of a memory storing data, which may affect the output of the mother code encoder. In an example, if the constraint length is K and a number of registers is m, then K=m+1. As an example, if the constraint length is 7, the convolutional code encoding may be performed with a 6-bit register and single-bit input data. In the example embodiment of FIG. 4 as illustrated, a number of D-flipflops may equal six, and the six D-flipflops and the single-bit input data may affect output data and thus, the convolutional code encoder may have a constraint length where m=6 and K=6+1=7.

Figure 5:
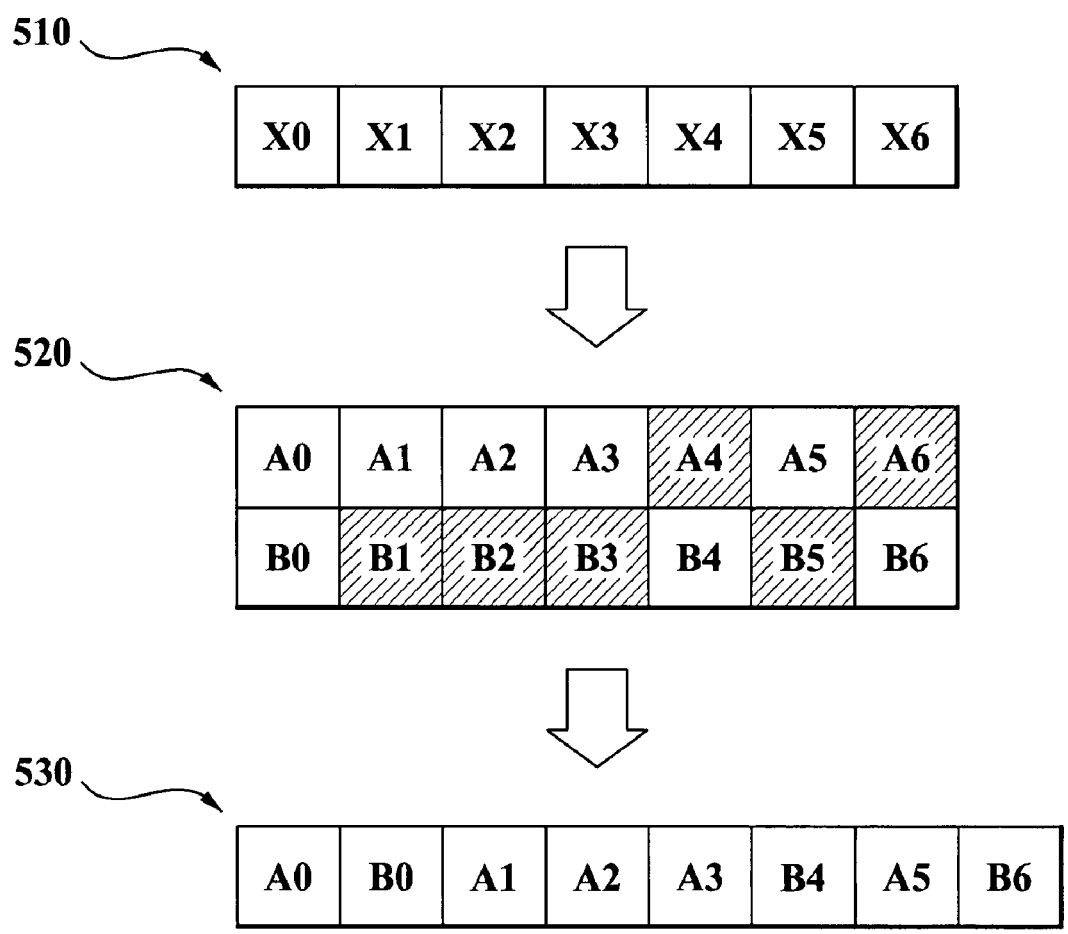
FIG. 5 illustrates an operation of a puncturing module according to another example embodiment of the present invention.

FIG. 5 illustrates an operation of a puncturing module according to another example embodiment of the present invention.

In the example embodiment of FIG. 5, seven bits of input data 510 may be converted or encoded into 14 bits of a convolutional code 520 by utilizing the mother code encoder of FIG. 4. For example, the mother code encoder of FIG. 4 may correspond to a convolutional code encoder with a code rate of ½. If the convolutional code encoder of FIG. 4 corresponds to the mother code encoder 222 of FIG. 3, the outer encoded bit stream 215 may correspond to the input data 430 and the input data 510, and the convolutional code 223 may correspond to the convolutional code 520.

In the example embodiment of FIG. 5, the puncturing module 224 may puncture a given number of bits of the conventional code 223 to generate the inner encoded bit stream 225. In an example, "puncturing" may indicate reducing or removing the given number of bits from input data. As an example, the puncturing module 224 may reduce or remove the given number of bits of the convolutional code 223 according to a given rule or protocol, and may generate the inner encoded bit stream 225. If the bit streams shown in the example embodiment of FIG. 5 are generated by the inner encoder of FIG. 3, the outer encoded bit stream 510 may be coded to the convolutional code 520 with the code rate of ½ by the mother code encoder 222. If the outer encoded bit stream 510 includes seven bits, the convolutional code 520 may include 14 bits. Eight bits of the inner encoded bit stream 530 may be generated by reducing or removing six bits, A4, A6, B1, B2, B3, and B5, from the convolutional code 520 according to the given rule. Accordingly, in an example, the inner coder of FIG. 5 may have a code rate of ⅞.

Although the operation of the puncturing module 224 of the example embodiment FIG. 5 may reduce or remove six bits, it is understood that other example embodiments of the present invention may be directed to an operation of the puncturing module 224 removes/reduces any number of bits. Accordingly, the puncturing module 224 may be configured to adjust a code rate of inner encoding. For example, an error correction scheme may be applied to an MLC memory using puncturing and thereby adjust the size of overhead by the error correction scheme. Also, it will be appreciated that a desired code rate may be achieved irrespective of a number of bits configured to be stored in a single cell.

In another exemplary embodiment of the present invention, referring to FIG. 2, the inner encoder 220 may exclude the puncturing module 224 (e.g., such that the mother code encoder 222 and not the puncturing module 224 may be included). In this example, the mother code encoder 222 may generate the convolutional code 223 by encoding the outer encoded bit stream 215 according to a convolutional code encoding, and need not perform puncturing.

Figure 6:
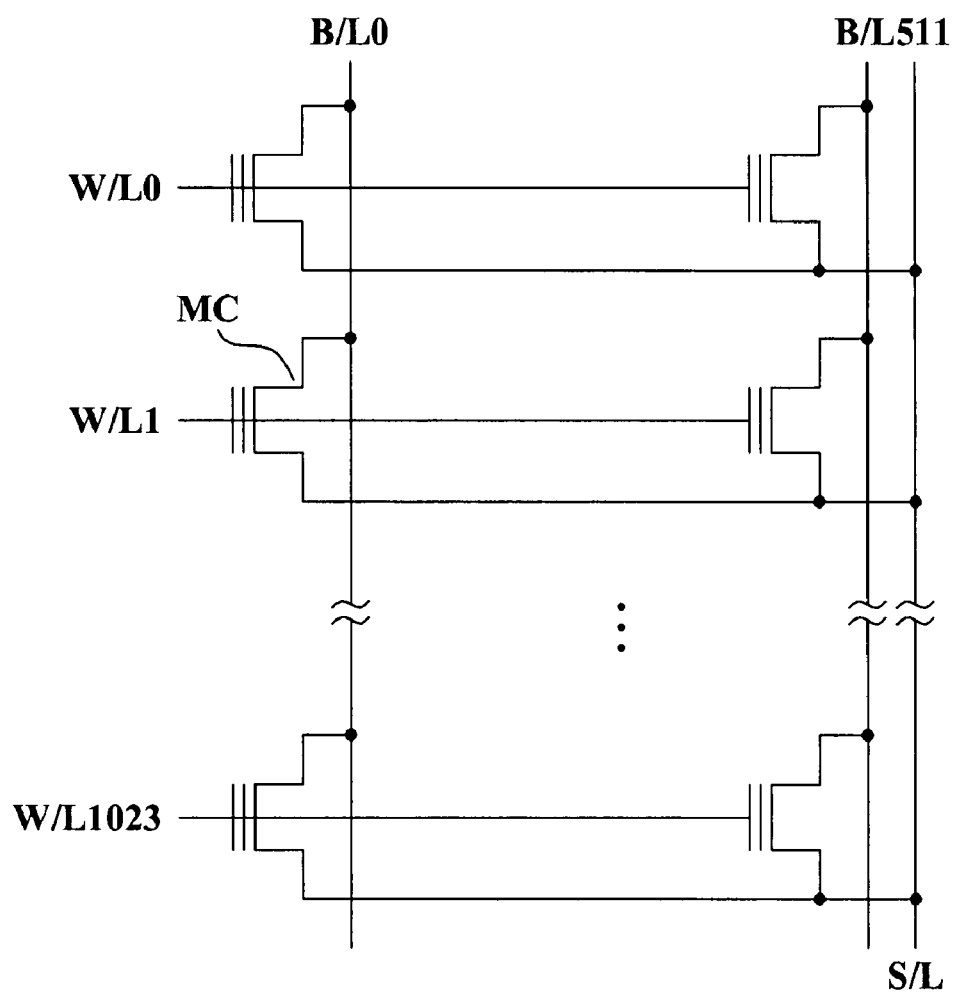
FIG. 6 illustrates a memory cell array according to another example embodiment of the present invention.

FIG. 6 illustrates a memory cell array according to another example embodiment of the present invention. In an example, the memory cell array of FIG. 6 may correspond to an MLC memory cell array, such as a flash memory. B/L0 through B/L511 may indicate bit lines, and W/L0 through W/L1023 may indicate word lines. Also, may S/L indicate a source line, and MC may indicate memory cells. In an example, the memory cell of the memory cell array shown in FIG. 6 may correspond to an MLC memory cell capable of storing more than two bits of data in a single memory cell.

Figure 7:
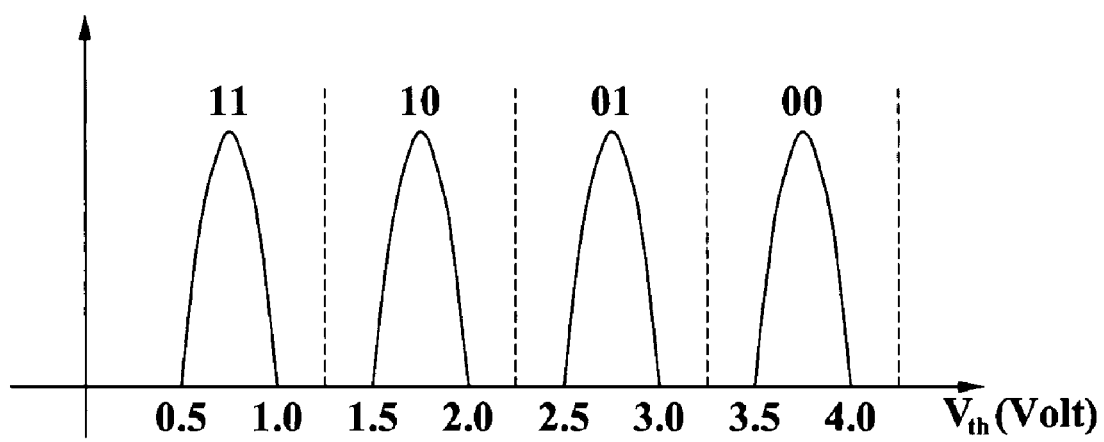
FIGS. 7 and 8 illustrate an operation of a signal mapping module and a signal demapping module according to another example embodiment of the present invention.
Figure 8:
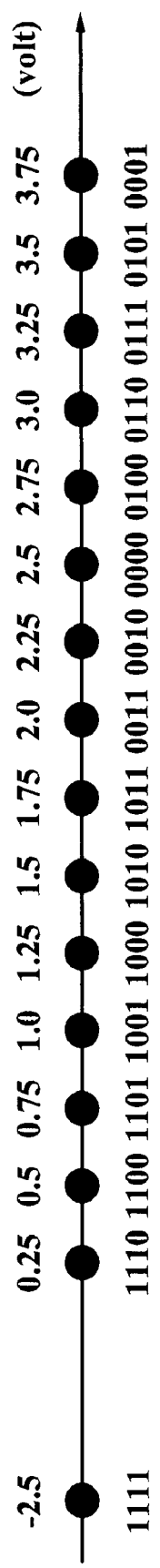

FIGS. 7 and 8 illustrate an operation of the signal mapping module 230 and the signal demapping module 270 of FIG. 2 according to another example embodiment of the present invention. In particular, FIG. 7 illustrates an example embodiment where a signal mapping is performed to store two-bit data in a single memory cell, while FIG. 8 illustrates an example embodiment where a signal mapping is performed to store four-bit data in a single memory cell.

In the example embodiment of FIG. 7, if a voltage acquired from the MLC memory cell 250 is within a first range (e.g., 0.5 volts to 1.0 volts), the signal demapping module 270 determine the acquired voltage a first logic sequence (e.g., "11"). If the voltage acquired from the MLC memory cell 250 is within a second range (e.g., 1.5 volts to 2.0 volts), the signal demapping module 270 may determine the acquired voltage as a second logic sequence (e.g., "10"). If the voltage acquired from the MLC memory cell 250 is within a third range (e.g., 2.5 volts to 3.0 volts), the signal demapping module 270 may determine the acquired voltage as a third logic sequence (e.g., "01"). If the voltage acquired from the MLC memory cell 250 is within a fourth range (e.g., 3.5 volts to 4.0 volts), the signal demapping module 270 may determine the acquired voltage as a fourth logic sequence (e.g., "00"). Data stored in the MLC memory cell 250 may be classified based on a difference between cell currents or cell voltages during a data read operation.

In the example embodiment of FIG. 7, if a bit of the inner encoded bit stream 225 may correspond to the first logic sequence (e.g., "11"), the signal mapping module 230 may apply a program pulse to the MLC memory cell 250 such that a voltage level stored in the MLC memory cell 250 may be within the first range (e.g., 0.5 volts to 1.0 volts). In an example, the program pulse may be generated by a PAM. If the bit of the inner encoded bit stream 225 corresponds to the second logic sequence (e.g., "10"), the signal mapping module 230 may apply the program pulse to the MLC memory cell 250 such that the voltage level stored in the MLC memory cell 250 may be within the second range (e.g., 1.5 volts to 2.0 volts). If the bit of the inner encoded bit stream 225 corresponds to the third logic sequence (e.g., "01"), the signal mapping module 230 may apply the program pulse to the MLC memory cell 250 such that the voltage level stored in the MLC memory cell 250 may be within the third range (e.g., 2.5 volts to 3.0 volts). If the bit of the inner encoded bit stream 225 corresponds to the fourth logic sequence (e.g., "00"), the signal mapping module 230 may apply the program pulse to the MLC memory cell 250 such that the voltage level stored in the MLC memory cell 250 may be within the fourth range (e.g., 3.5 volts to 4.0 volts).

In the example embodiment of FIG. 7, an example where the MLC memory cell 250 corresponds to an MLC flash memory cell, and the third logic sequence (e.g., "01") is stored in the MLC memory cell 250 will now be described. The signal mapping module 230 may gradually increase a voltage of the MLC memory cell 250 in a positive direction while gradually increasing a word line voltage of the MLC memory cell 250. The signal mapping module may verify whether a threshold voltage of the memory cell reaches the third range (e.g., 2.5 volts to 3.0 volts). To store the third logic sequence (e.g., "01") in the MLC memory cell 250, the MLC memory cell 250 may transition to the third logic sequence (e.g., "01") by sequentially transitioning through the first logic sequence (e.g., "11") and the second logic sequence (e.g., "10").

In another example, FIG. 8 illustrates an operation of storing data in the MLC memory cell 250 by the signal mapping module 230 according to a Gray coding. In an example, the Gray coding may indicate a coding scheme which utilizes a Hamming distance of 1 between neighboring codes. As shown in the example embodiment of FIG. 8, a difference between neighboring codes, for example, a code "1100" and a code "1101" may only be a single bit. If a code is acquired with a voltage level acquired from the MLC memory cell 250 by the signal demapping module 270, and the voltage level corresponds to an intermediate value between the code "1100" and the code "1101", the signal demapping module 270 may determines the voltage level as either the code "1100" or the code "1101", such at in a worst case scenario only a single bit is wrong. Also, if a bit difference between neighboring bits is more than two bits, then more than two bits may be wrong. Therefore, if Gray coding is utilized, the signal demapping module 270 may determine the voltage level as a wrong code, and a potential error may be reduced and/or minimized In the example embodiment of FIG. 8, the signal mapping module 230 may store four-bit data in a single memory cell. If the MLC memory cell 250 corresponds to an m-bit memory cell, the signal mapping module 230 may determine any one of $2^m$ number of levels that may be generated by a $2^m$ PAM, and may apply a program pulse of the determined level to the MLC memory cell 250.

As shown in the example embodiments of FIGS. 7 and 8, a voltage window with respect to a single memory cell may be relatively limited. For example, the voltage window of the MLC memory cell 250 may be within the range of −2.5 volts to 4 volts. Referring to the example embodiment of FIG. 7, in the limited voltage window, two bits may be stored in a single MLC memory cell and thus four distributions may be formed. Also, referring to the example embodiment of FIG. 8, in the limited voltage window, four bits may be stored in the single MLC memory cell and thus 16 distributions may be formed. As described above, in order to store an m number of bits in a single memory cell, $2^m$ number of distributions may be formed. However, because the voltage window may be relatively limited, a threshold voltage difference between neighboring bits may decrease as m increases. Accordingly, an error possibility may increase during storing and/or reading operations of an MLC memory cell. However, example embodiments of the present invention allow error to be detected and corrected by utilizing a concatenated coding where an outer coding and an inner coding may be concatenated, and thus a relatively dense MLC memory device capable of storing more than four bits in a single memory cell may be obtained.

Figure 9:
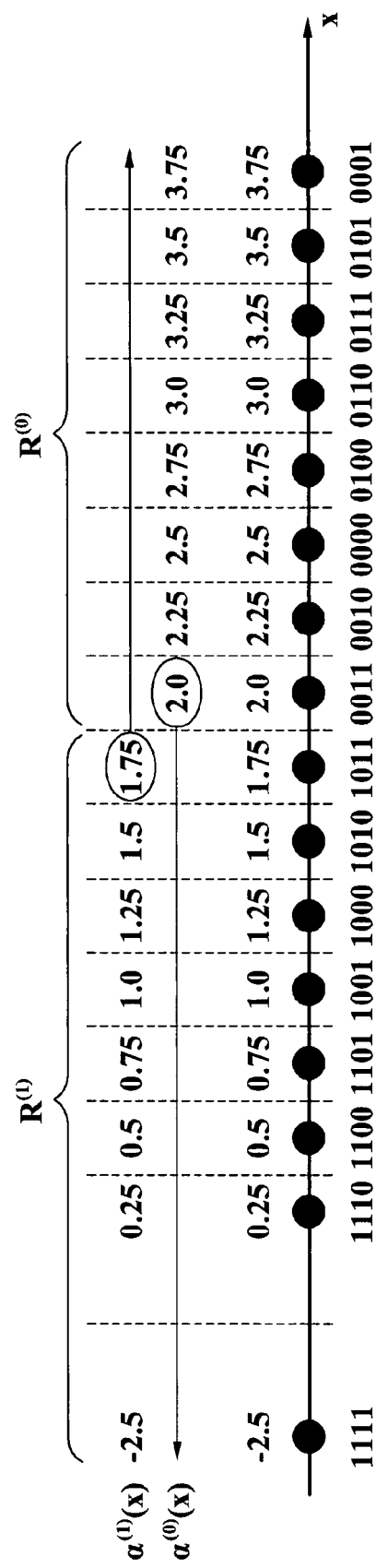
FIG. 9 illustrates an operation of a signal demapping module performing a soft decision according to another example embodiment of the present invention.

FIG. 9 illustrates an operation of the signal demapping module 270 of FIG. 2 performing a soft decision according to another example embodiment of the present invention.

In the example embodiment of FIG. 9, if the signal mapping module 230 utilizes a Gray coding, the signal demapping module 270 may likewise utilizes the Gray coding. Also, if the signal demapping module 270 performs a soft decision, the demapped bit stream 275 generated by the signal demapping module 270 may include a bit stream generated by the Gray coding and an additional bit stream generated as follows:

$$y_{MSB(soft)} \approx \min_{\alpha^{(0)} \in R^{(0)}} (x - \alpha^{(0)})^2 - \min_{\alpha^{(1)} \in R^{(1)}} (x - \alpha^{(1)})^2 \quad \text{Equation 1}$$
$$= (\alpha^{(1)}(x) - \alpha^{(0)}(x)) \times (2x - (\alpha^{(1)}(x) + \alpha^{(0)}(x)))$$

In the example embodiment of FIG. 9, referring to Equation 1, $\alpha^{(1)}(\chi)$ may correspond to a function with a value if an output pulse output from the MLC memory cell 250 includes a distribution as shown in FIG. 9. As an example, if the output pulse output from the MLC memory cell 250 has a value of more than 1.75 volts, $\alpha^{(1)}(\chi)$ may have a value of 1.75. Also, if the output pulse output from the MLC memory cell 250 has a value of 0.5 volts, $\alpha^{(1)}(\chi)$ may have a value of 0.5. In Equation 1, $\chi$ may indicate a voltage value of the output pulse, $\alpha^{(0)}(\chi)$ may correspond to a function with a value if the output pulse output from the MLC memory cell 250 includes a distribution as shown in FIG. 9. As an example, if the output pulse output from the MLC memory cell 250 has a value of 2.0 volts, $\alpha^{(0)}(\chi)$ may likewise have a value of 2.0. In another example, if the output pulse output from the MLC memory cell 250 has a value of 3.0 volts, $\alpha^{(0)}(\chi)$ may have a value of 3.0, and so on.

In an example, a value calculated by Equation 1 may correspond to soft decision information, or information indicating an accuracy of a bit value that is determined by the signal demapping module 270. If the signal demapping module 270 generates the demapped bit stream 275 by performing a soft decision, from the output pulse 245, the inner decoder 280 may explicitly determine a bit stream, which may be generated according to a Gray coding, from the demapped bit stream 275 by performing the soft decision, based on the soft decision information.

Figure 10:
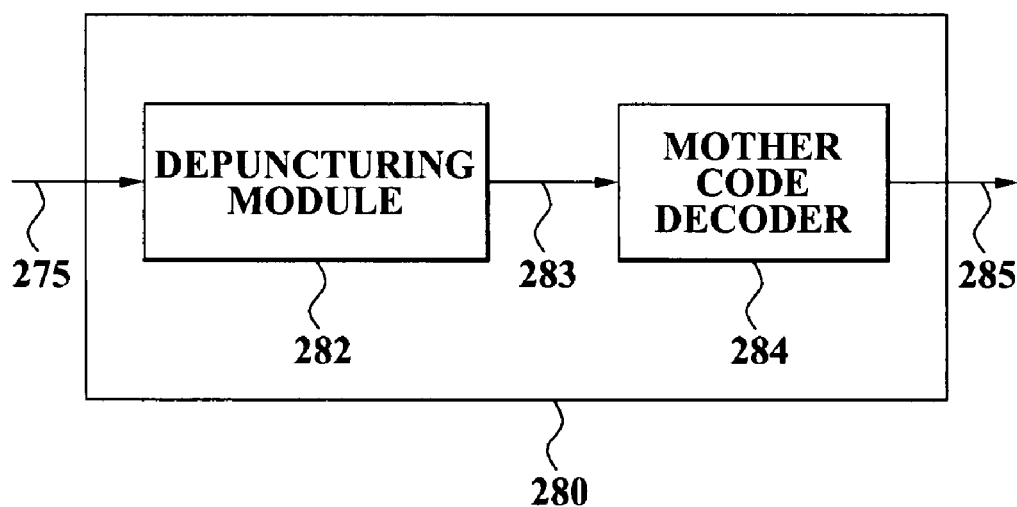
FIG. 10 is a block diagram illustrating an inner decoder according to another example embodiment of the present invention.

FIG. 10 is a block diagram illustrating the inner decoder 280 of FIG. 2 according to another example embodiment of the present invention.

In the example embodiment of FIG. 10, the inner decoder 280 may include a depuncturing module 282 and a mother code decoder 284. The depuncturing module 282 may restore a punctured bit to the demapped bit stream 275 to generate a depunctured bit stream 283. In an example, a depuncturing of the depuncturing module 282 may correspond to a puncturing of the puncturing module 224. Also, the depuncturing may restore an original bit stream by adding a bit may previously have been reduced/removed by puncturing. As an example, if the puncturing module 224 reduces or removes a given number of bits from the convolutional code 223 according to a given rule or protocol to generate the inner encoded bit stream 225, the depuncturing module 282 may restore the punctured bit(s) to the demapped bit stream 275 corresponding to the given rule and thereby to generate the depunctured bit stream 283.

In the example embodiment of FIG. 10, the mother code decoder 284 may decode the depunctured bit stream 283 by a Viterbi decoding to generate the inner decoded bit stream 285. In an example, the Viterbi decoding may correspond to the convolutional code encoding of the mother code encoder 222.

Figure 11:
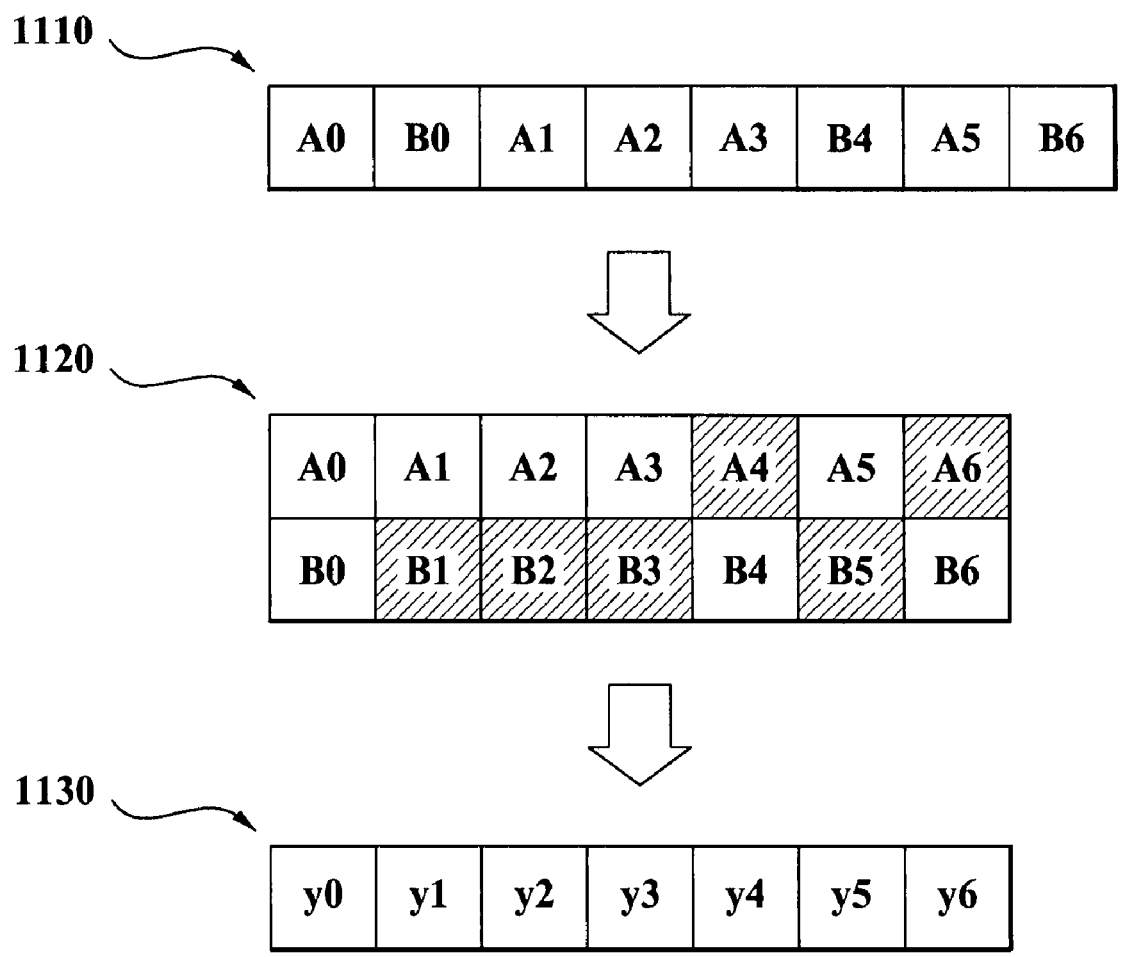
FIG. 11 illustrates an operation of a depuncturing module and a mother code decoder according to another example embodiment of the present invention.

FIG. 11 illustrates an operation of the depuncturing module 282 of FIG. 10 and the mother code decoder 284 according to another example embodiment of the present invention.

In the example embodiment of FIG. 11, a demapped bit stream 1110 output from the signal demapping module 270 may include, for example, seven bits. The demapped bit stream 1110 may be generated into a depunctured bit stream 1120 by the depuncturing module 282. As shown in the example embodiment of FIG. 11, the depunctured bit stream 1120 may be restored to punctured bit streams (e.g., see FIG. 5) and may include 14 bits. For example, the punctured six bits, A4, A6, B1, B2, B3, and B5 from FIG. 5 may be added or "restored". The mother code decoder 284 may decode the depunctured bit stream 1120 to generate, for example, seven bits, of an inner decoded bit stream 1130.

In another example embodiment of the present invention, the inner decoder 280 may exclude the depuncturing module 282 and need only include the mother code decoder 284. In this example, the inner decoder 280 may generate the inner decoded bit stream 282 by decoding the demapped bit stream 275 (e.g., according to Viterbi decoding) and need not perform puncturing.

Example embodiments of the present invention may include computer-readable media including program instructions to implement various operations embodied by a computer. The media may also include, alone or in combination with the program instructions, data files, data structures, and the like. Examples of computer-readable media include magnetic media such as hard disks, floppy disks, and magnetic tape, optical media such as CD ROM disks and DVD, magneto-optical media such as optical disks and/or hardware devices that may be specially configured to store and perform program instructions, such as read-only memory (ROM), random access memory (RAM), flash memory, and the like. Examples of program instructions may include both machine code, such as produced by a compiler, and files containing higher level code that may be executed by the computer using an interpreter.

As an example, a portion of the outer encoder 210, the inner encoder 220, the signal mapping module 230, the signal demapping module 270, the inner decoder 280, and the outer decoder 290 may be implemented within a computer program. Accordingly, a computer program including such functionality is another example embodiment of the present invention.

In another example embodiment of the present invention, a bit density of a memory cell may be increased with improved reliability. For example, conventional memory device may include no more than four bits within a single memory cell due to reliability problems or errors which scale proportionately to the number of bits included in a given cell. However, a memory cell according to example embodiments of the present invention need not be limited to a lower-density implementation such as a four bit memory cell. In another example, the increased memory density provided by example embodiments of the present invention may be greater than overhead associated with an implementation of the example embodiments (e.g., additional circuitry, etc.).

In another example, a conventional error correction scheme applied to an MLC memory may be inapplicable if a raw error rate is relatively high, for example, a bit error rate (BER) may be more than 0.01. However, an error correction scheme according to example embodiments of the present invention may remain effective even at higher raw error rates, such as BER>0.01. Also, in the conventional art, if a number of bits in a single memory cell of the MLC memory cell increases, a threshold voltage difference between neighboring bits decrease and a read failure rate may increase, while such results need not occur in accordance with example embodiments of the present invention.

In another example embodiment of the present invention, an error correction scheme may be applied to an MLC memory so as to adjust an amount of overhead by the error correction scheme. Accordingly, a code rate may be adjusted or "fine-tuned" (e.g., to achieve an adequate error correction vs. performance ratio) to accommodate for a number of bits to be stored within a single memory cell.

In another example embodiment of the present invention, performance characteristics (e.g., a reliability, a productivity, etc.) of a flash memory may be augmented by correcting an error included in a read signal from an MLC memory.

In another example embodiment of the present invention, an error correction scheme may be implemented which may be robust against both a random error and a burst error in an MLC memory.

Example embodiments having thus been described, it will be obvious that the same may be varied in many ways. For example, the methods according to example embodiments may be implemented in hardware and/or software. The hardware/software implementations may include a combination of processor(s) and article(s) of manufacture. The article(s) of manufacture may further include storage media and executable computer program(s), for example, a computer program product stored on a computer readable medium. The executable computer program(s) may include the instructions to perform the described operations or functions. The computer executable program(s) may also be provided as part of externally supplied propagated signal(s).

Further, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention. Likewise, the first, second . . . , logic sequences may correspond to any combination of first and second logic levels (e.g., "1000", "1010", etc.) in other example embodiments of the present invention, and need not be limited to the above-described and illustrated example embodiments.

Such variations are not to be regarded as a departure from the intended spirit and scope of example embodiments, and all such modifications as would be obvious to one skilled in the art are intended to be included within the scope of the following claims.

What is claimed is:

1. A Multi-Level Cell (MLC) memory device configured to perform data operations, comprising:
   an MLC memory cell;
   a first coding device performing a first coding function, the first coding function being one of an encoding function and a decoding function;
   a second coding device performing a second coding function, the second coding function being one of an encoding function and a decoding function; and
   a signal module configured to perform at least one of instructing the MLC memory cell to store data output by the second coding device if the first and second coding functions are encoding functions, and generating a demapped bit stream based on data retrieved from the MLC memory cell if the first and second coding functions are decoding functions.

2. The MLC memory device of claim 1, wherein
   the first coding function is a first encoding function and the second coding function is a second encoding function,
   the first coding device is an outer encoder encoding data based on the first encoding function to generate an outer encoded bit stream,
   the second coding device is an inner encoder encoding the outer encoded bit stream based on the second encoding function to generate an inner encoded bit stream, and
   the signal module is a signal mapping module instructs the MLC memory cell to store the inner encoded bit stream as the stored data in the MLC memory cell.

3. The MLC memory device of claim 2, wherein the MLC memory cell corresponds to an m-bit MLC memory cell with m being a positive integer, and the signal mapping module instructing the MLC memory cell via a program pulse corresponding to any one of $2^m$ number of voltage distributions generated by a $2^m$ pulse amplitude modulation (PAM).

4. The MLC memory device of claim 2, wherein the first encoding scheme includes linear block encoding.

5. The MLC memory device of claim 2, wherein the second encoding scheme includes convolutional code encoding.

6. The MLC memory device of claim 2, wherein the inner encoder includes:
   a mother code encoder encoding the outer encoded bit stream with convolutional code encoding to generate a convolutional code; and
   a puncturing module puncturing at least one bit of the convolutional code to generate the inner encoded bit stream.

7. The MLC memory device of claim 2, wherein the inner encoded bit stream generated by the inner encoder includes a systematic code.

8. The MLC memory device of claim 2, wherein the inner encoded bit stream generated by the inner encoder includes a non-systematic code.

9. The MLC memory device of claim 3, wherein the signal mapping module generates the program pulse according to a Gray coding process.

10. The MLC memory device of claim 2, further comprising:
    a signal demapping module generating a demapped bit stream from an output pulse in response to a read signal, the output pulse being output from the MLC memory cell.

11. The MLC memory device of claim 10, wherein the signal demapping module generates the demapped bit stream by performing a hard decision based on the outside pulse.

12. The MLC memory device of claim 10, further comprising:
    an inner decoder decoding the demapped bit stream by a first decoding function to generate an inner decoded bit stream, the first decoding function corresponding to the second encoding function.

13. The MLC memory device of claim 12, wherein the signal demapping module generates the demapped bit stream by performing a soft decision based on the output pulse.

14. The MLC memory device of claim 12, wherein the first decoding function includes convolutional code decoding.

15. The MLC memory device of claim 12, wherein the inner decoder includes:
    a depuncturing module restoring a punctured bit to the demapped bit stream to generate a depunctured bit stream; and
    a mother code decoder decoding the depunctured bit stream with a Viterbi decoding function to generate the inner decoded bit stream.

16. The MLC memory device of claim 12, further comprising:
    an outer decoder decoding the inner decoded bit stream by with a second decoding function to generate an outer decoded bit stream, the second decoding function corresponding to the first encoding function.

17. The MLC memory device of claim 1, wherein the MLC memory cell is a memory cell of an MLC flash memory.

18. The MLC memory of claim 1, wherein
    the first coding function is a first decoding function and the second coding function is a second decoding function,
    the signal module is a signal demapping module generating the demapped bit stream based on data retrieved from the MLC memory cell,
    the first coding device is an inner decoder decoding the demapped bit stream based on the second decoding function to generate an inner decoded bit stream, and
    the second coding device is an outer decoder decoding the inner decoded bit stream based on the first decoding function to generate an outer decoded bit stream.

19. The MLC memory device of claim 18, wherein the inner decoder is configured to correct an error detected within the demapped bit stream to generate the inner decoded bit stream, and the outer decoder is configured to correct an error detected from the inner decoded bit stream to generate the outer decoded bit stream.

20. The MLC memory device of claim 19, wherein the outer decoder reports an error if an error is detected in the inner decoded bit stream and not corrected.

21. The MLC memory device of claim 18, wherein the signal demapping module generates the demapped bit stream by performing a soft decision based on an output pulse received from the MLC memory cell in order to generate the demapped bit stream.

22. The MLC memory device of claim 18, wherein the MLC memory cell corresponds to an m-bit MLC memory cell with m being a positive integer, and the signal demapping module compares an output pulse received from the MLC memory cell with a threshold voltage of $2^m$ voltage distributions associated with the MLC memory cell to generate the demapped bit stream corresponding to the output pulse.

23. The MLC memory device of claim 18, wherein the MLC memory cell is a memory cell of an MLC flash memory.

24. A method of performing a data operation with a Multi-Level Cell (MLC) memory device, comprising:
performing a first coding function, the first coding function being one of an encoding function and a decoding function;
performing a second coding function, the second coding function being one of an encoding function and a decoding function; and
performing at least one of instructing a MLC memory cell to store data output as a result of the second coding function if the first and second coding functions are encoding functions, and generating a demapped bit stream based on data retrieved from the MLC memory cell if the first and second coding functions are decoding functions.

25. The method of claim 24, wherein
the first coding function is a first encoding function and the second coding function is a second encoding function.

26. The method of claim 25, further comprising:
encoding data based on the first encoding function to generate an outer encoded bit stream,
encoding the outer encoded bit stream based on the second encoding function to generate an inner encoded bit stream, and
instructing the MLC memory cell to store the inner encoded bit stream as the stored data in the MLC memory cell.

27. The method of claim 24, wherein
the first coding function is a first decoding function and the second coding function is a second decoding function.

28. The method of claim 27, further comprising:
generating the demapped bit stream based on data retrieved from the MLC memory cell;
decoding the demapped bit stream based on the second decoding function to generate an inner decoded bit stream; and
decoding the inner decoded bit stream based on the first decoding function to generate an outer decoded bit stream.

* * * * *